(12) United States Patent
Wu et al.

(10) Patent No.: US 12,218,020 B2
(45) Date of Patent: Feb. 4, 2025

(54) SEMICONDUCTOR PACKAGES

(71) Applicant: Taiwan Semiconductor Manufacturing Company, Ltd., Hsinchu (TW)

(72) Inventors: Jiun-Yi Wu, Taoyuan (TW); Chen-Hua Yu, Hsinchu (TW); Chung-Shi Liu, Hsinchu (TW); Yu-Min Liang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 23 days.

(21) Appl. No.: 17/695,864

(22) Filed: Mar. 16, 2022

(65) Prior Publication Data
US 2022/0208633 A1    Jun. 30, 2022

Related U.S. Application Data

(63) Continuation of application No. 16/655,264, filed on Oct. 17, 2019, now Pat. No. 11,282,761.

(60) Provisional application No. 62/773,139, filed on Nov. 29, 2018.

(51) Int. Cl.
*H01L 29/423* (2006.01)
*H01L 21/56* (2006.01)
*H01L 23/00* (2006.01)
*H01L 23/31* (2006.01)

(52) U.S. Cl.
CPC ........ *H01L 23/3135* (2013.01); *H01L 21/563* (2013.01); *H01L 23/3128* (2013.01); *H01L 23/3142* (2013.01); *H01L 24/17* (2013.01); *H01L 2224/02335* (2013.01); *H01L 2224/12105* (2013.01)

(58) Field of Classification Search
CPC ............ H01L 23/3135; H01L 23/3142; H01L 23/53295; H01L 2224/0233; H01L 2224/02335
USPC ................................. 257/786, 723
See application file for complete search history.

(56) References Cited

U.S. PATENT DOCUMENTS

| | | | | |
|---|---|---|---|---|
| 5,241,456 A | * | 8/1993 | Marcinkiewicz | ....... H01L 24/24 174/250 |
| 9,443,824 B1 | * | 9/2016 | We | ....... H01L 23/3114 |
| 10,276,541 B2 | * | 4/2019 | Chen | ....... H01L 25/0657 |
| 2014/0360767 A1 | * | 12/2014 | Terui | ....... H01L 24/19 174/261 |
| 2015/0187742 A1 | * | 7/2015 | Kwon | ....... H01L 24/24 438/126 |
| 2016/0085899 A1 | * | 3/2016 | Qian | ....... H01L 23/5383 257/774 |

(Continued)

*Primary Examiner* — Nitin Parekh
(74) *Attorney, Agent, or Firm* — JCIPRNET

(57) ABSTRACT

A semiconductor package includes a circuit structure, a first redistribution layer, a second redistribution layer, a first encapsulant, a bus die and a plurality of through vias. The first redistribution layer is disposed over the circuit structure. The second redistribution layer is disposed over the first redistribution layer. The first encapsulant is disposed between the first redistribution layer and the second redistribution layer. The through vias surround the bus die. The first encapsulant is extended along an entire sidewall of the bus die, and a first surface of the bus die is substantially coplanar with top surfaces of the first encapsulant and the plurality of through vias.

20 Claims, 10 Drawing Sheets

(56) References Cited

U.S. PATENT DOCUMENTS

| | | | |
|---|---|---|---|
| 2016/0118333 A1* | 4/2016 | Lin | H01L 22/20 257/773 |
| 2017/0011993 A1* | 1/2017 | Zhao | H01L 23/49838 |
| 2018/0226364 A1* | 8/2018 | Kim | H01L 23/585 |

* cited by examiner

SEMICONDUCTOR PACKAGES

CROSS-REFERENCE TO RELATED APPLICATION

This application is a continuation application of and claims the priority benefit of a prior application Ser. No. 16/655,264, filed on Oct. 17, 2019 and now allowed, and the priority benefit of U.S. provisional application Ser. No. 62/773,139, filed on Nov. 29, 2018. The entirety of each of the above-mentioned patent applications is hereby incorporated by reference herein and made a part of this specification.

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, communication between the dies has become a more challenging issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
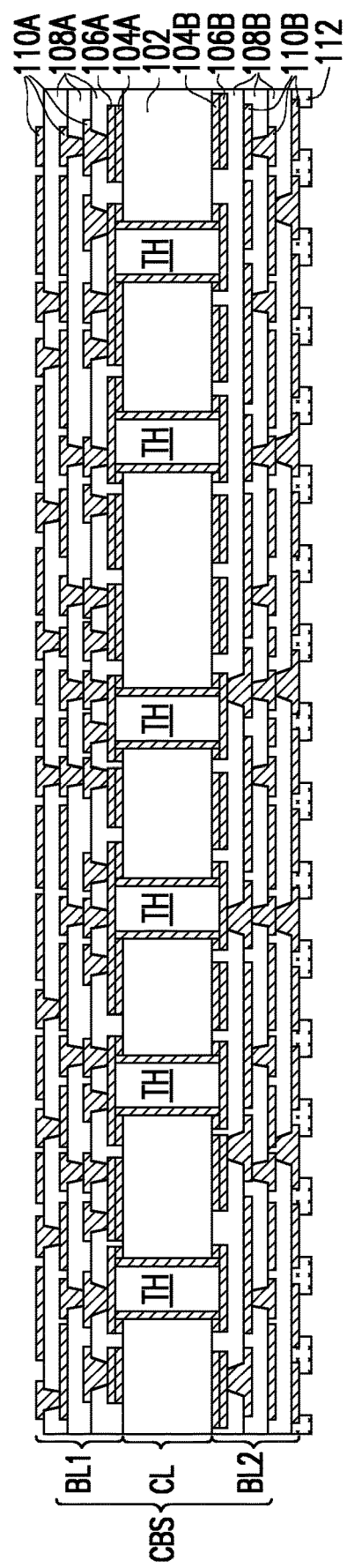
FIG. 1A to FIG. 1I are schematic sectional views of various stages in a method of fabricating a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or over a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic sectional views of various stages in a method of fabricating a semiconductor package according to some embodiments of the present disclosure. Referring to FIG. 1A, a circuit board structure CBS is provided. In some embodiments, the circuit board structure CBS includes a core layer CL and first and second build-up layers BL1, BL2 respectively located on two surfaces of the core layer CL. In some embodiments, the core layer CL includes a core dielectric layer 102, core conductive layers 104A and 104B, conductive lids 106A and 106B, and plated through holes TH. In some embodiments, the core dielectric layer 102 includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. However, the disclosure is not limited thereto, and other dielectric materials may also be used. The core conductive layers 104A and 104B are formed respectively on the opposite sides of the core dielectric layer 102. In some embodiments, the core conductive layers 104A and 104B include copper, gold, tungsten, aluminum, silver, gold, a combination thereof, or the like. The conductive lids 106A and 106B are located respectively over the core conductive layers 104A and 104B. In some embodiments, the conductive lids 106A and 106B include copper or other suitable conductive material, for example.

In some embodiments, the plated through holes TH are disposed in and penetrate through the core dielectric layer 102, which provide electrical connection between the core conductive layer 104A and the core conductive layer 104B. In other words, the plated through holes TH provide electrical paths between the electrical circuits located on two opposing sides of the core dielectric layer 102. In some embodiments, the plated through holes TH may be lined with a conductive material and filled up with an insulating material. In some embodiments, the method of forming the plated through holes TH includes the following operations. First, through holes (not shown) are formed in the core dielectric layer 102 at the predetermined positions by, for example, a mechanical or laser drilling, an etching, or another suitable removal technique. A desmear treatment may be performed to remove residues remaining in the through holes. Subsequently, the sidewall of the through holes may be plated with one or more conductive materials to a predetermined thickness, thereby providing the plated through holes TH. For example, the through holes may be plated with copper or other conductive material with an electroplating or an electroless plating.

In some embodiments, the core conductive layers 104A and 104B, the conductive lids 106A and 106B, and the plated through holes TH may be formed by the following steps. First, first conductive material (not shown) is respectively formed on two opposite surfaces of the core dielectric layer 102. Then, the plated through holes TH are formed to penetrate the core dielectric layer 102 as mentioned before and provide electrical connection between the first conductive material respectively formed on both surfaces of the core dielectric layer 102. Thereafter, second conductive material is respectively formed over the first conductive material on the opposite surfaces of the core dielectric layer 102, where the second conductive material may be different from the first conductive material. In some embodiments, the first and second conductive materials may be formed by using any suitable method (e.g., chemical vapor deposition (CVD), sputtering, printing, plating, or the like). Then, the first conductive materials and the second conductive materials may be patterned together to form the core conductive layers 104A and 104B and the conductive lids 106A and 106B respectively. In some embodiments, the first and second conductive materials may be partially removed using a photolithography and etching process or another suitable removal technique.

The first and second build-up layers BL1 and BL2 are respectively disposed on the opposite sides of the core layer CL. Specifically, the first build-up layer BL1 is formed over the core conductive layer 104A of the core layer CL, and the second build-up layer BL2 is formed over the core conductive layer 104B of the core layer CL. In some embodiments, the formation of the first build-up layer BL1 may include sequentially forming a plurality of first dielectric layers 108A and a plurality of first conductive patterns 110A, where the first dielectric layers 108A and the first conductive patterns 110A are alternately stacked over the first surface of the core layer CL. Similarly, the formation of the second build-up layer BL2 may include sequentially forming a plurality of second dielectric layers 108B and a plurality of second conductive patterns 110B, where the second dielectric layers 108B and the second conductive patterns 110B are alternately stacked over the second surface of the core layer CL. In some embodiments, a material of the dielectric layers 108A, 108B may be ABF, prepreg, RCC, polyimide, PID, molding compound, a combination thereof, or the like. The dielectric layers 108A, 108B may be formed by a lamination process, a coating process, or the like. Although only three layers of conductive patterns and three layers of dielectric layers are illustrated for each of the first build-up layer BL1 and the second build-up layer BL2, the scope of the disclosure is not limited thereto. In other embodiments, the number of dielectric layers (108A/108B) and the number of the conductive patterns (110A/110B) may be adjusted upon the design requirements. In some embodiments, a thickness of the core layer CL is in a range of 30 µm to 2000 µm, for example. In some embodiments, a thickness of the dielectric layer 108A, 108B is in a range of 10 µm to 20 µm, and a thickness of the conductive pattern 110A, 110B is in a range of 10 µm to 20 µm, for example. The conductive pattern 110A, 110B include metal lines and vias. In some embodiments, the critical dimension of the via is in a range of 60 µm to 70 µm. In some embodiments, the total number of layers of the first build-up layer BL1 may sum up to a total of 0 to 8 layers for the conductive patterns and dielectric layers, and the total number of layers of the second build-up layer BL2 may sum up to a total of 0 to 8 layers for the conductive patterns and dielectric layers. In some alternative embodiments, at least one of the first build-up layer BL1 and the second build-up layer BL2 may be omitted. In some embodiments, the number of layers in the first build-up layer BL1 is equal to the number of layers in the second build-up layer BL2. In some alternative embodiments, the total number of the first build-up layer BL1 and the second build-up layer BL2 may be different. In some embodiments, the total number of layers of the first build-up layer BL1 and the second build-up layer BL2 in the circuit board structure CBS is less than the total number of layers of the build-up layer in the conventional circuit board structure which may be 28 to 36 layers. Therefore, the circuit board structure CBS may be also called a semi-finished circuit substrate or a semi-finished circuit carrier in some examples.

In some embodiments, a patterned mask layer 112 is formed over the second build-up layer BL2. As illustrated in FIG. 1A, the patterned mask layer 112 is formed over the outermost second dielectric layer 108B and the outermost second conductive patterns 110B. In some embodiments, the patterned mask layer 112 includes a plurality of openings that partially exposes the outermost second conductive patterns 110B. In some embodiments, the patterned mask layer 112 may be formed of materials having a chemical composition of silica, barium sulfate and epoxy resin, and/or the like. For example, the patterned mask layer 112 may be utilized as a solder mask and may be selected to withstand the temperatures of molten conductive materials (e.g., solders, metals, and/or metal alloys) to be subsequently disposed within the openings. In some alternative embodiments, a material of the patterned mask layer 112 may be molding compound or other suitable materials.

Figure 1B:
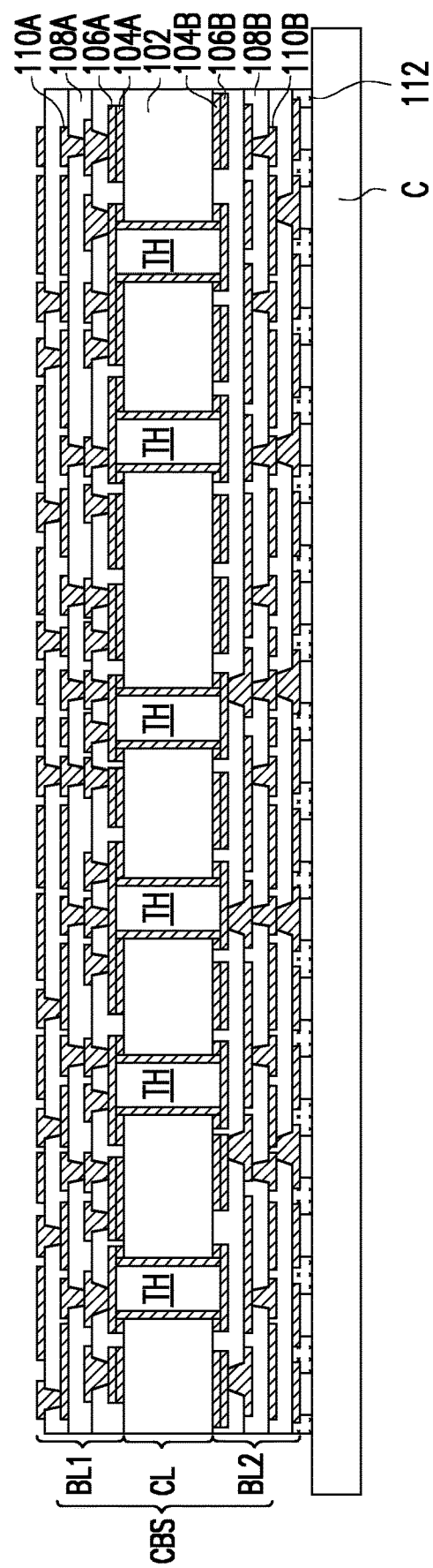

Referring to FIG. 1B, the circuit board structure CBS is placed on a carrier C. In some embodiments, the carrier C is a glass substrate or any suitable carrier for carrying a semiconductor wafer or a reconstituted wafer for the manufacturing method of the semiconductor package. In some embodiments, the second build-up layer BL2 is disposed between the core layer CL and the carrier C. In some alternative embodiments, a glue layer (not shown) may be formed on the patterned mask layer 112 between the circuit board structure CBS and the carrier C.

Figure 1C:
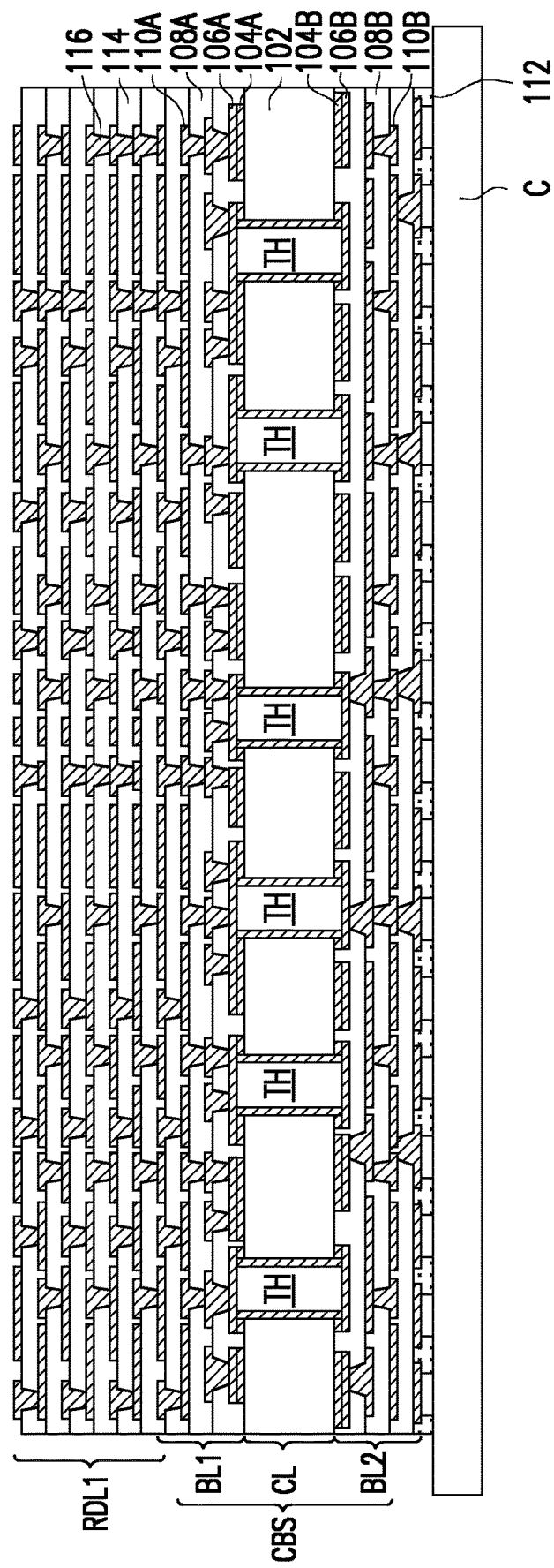

Referring to FIG. 1C, a redistribution layer structure RDL1 is formed over and electrically connected to the first build-up layer BL1. In some embodiments, the formation of the redistribution layer structure RDL1 may include sequentially forming a plurality of dielectric layers 114 and a plurality of conductive patterns 116, where the dielectric layers 114 and a plurality of conductive patterns 116 are alternately stacked over the outermost first dielectric layer 108A of the first build-up layer BL1. In some embodiments, the bottommost dielectric layer 114 is in contact with the outermost second dielectric layer 108A, and the bottommost conductive patterns 116 are in contact with the outermost first conductive patterns 110A to electrically connect the redistribution layer structure RDL1 and the first build-up layer BL1. In some embodiments, a thickness of the dielectric layer 114 is in a range of 2 µm to 10 µm. In some embodiments, a material of the dielectric layers 114 is polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a molding compound, a combination thereof or the like. In some alternative embodiments, the dielectric layers 114 made of organic compound and the dielectric layers 114 made of molding compound may be alternately disposed. In some embodiments, the dielectric layers 114 are formed by suitable fabrication techniques such as spin-on coating, chemical vapor deposition (CVD), plasma-enhanced chemical vapor deposition (PECVD) or the like. The disclosure is not limited thereto. The conductive patterns 116 include metal lines and vias. In some embodiments, the critical dimension of the via of the redistribution layer structure RDL1 is in a range of 7 µm to 35 µm. In some embodiments, the conductive patterns 116 include metal, such as aluminum, titanium, copper, nickel, tungsten, and/or alloys thereof. In some embodiments, the conductive patterns 116 may be formed by a deposition followed by a photolithography and etching process. In some embodiments, the conductive patterns 116 may be formed by an electroplating or an electroless plating. In some alternative embodiments, the first build-up layer BL1 may be omitted, and the redistribution layer structure RDL1 may be directly formed on the core layer CL.

In some embodiments, the material of the dielectric layer 114 of the redistribution layer structure RDL1 is different from the material of the dielectric layer 108A of the first build-up layer BL1. The thickness of the dielectric layer 114 of the redistribution layer structure RDL1 may be smaller than or substantially equal to the thickness of the dielectric layer 108A of the first build-up layer BL1. In addition, the critical dimension of the via of the redistribution layer structure RDL1 is smaller than the critical dimension of the via of the first build-up layer BL1. By forming the redistribution layer over the semi-finished circuit substrate, the formed structure has a high modulus and a reduced thickness. Furthermore, the rigidity, inductance and resistance of the entire semiconductor package are enhanced and cost is reduced.

Figure 1D:
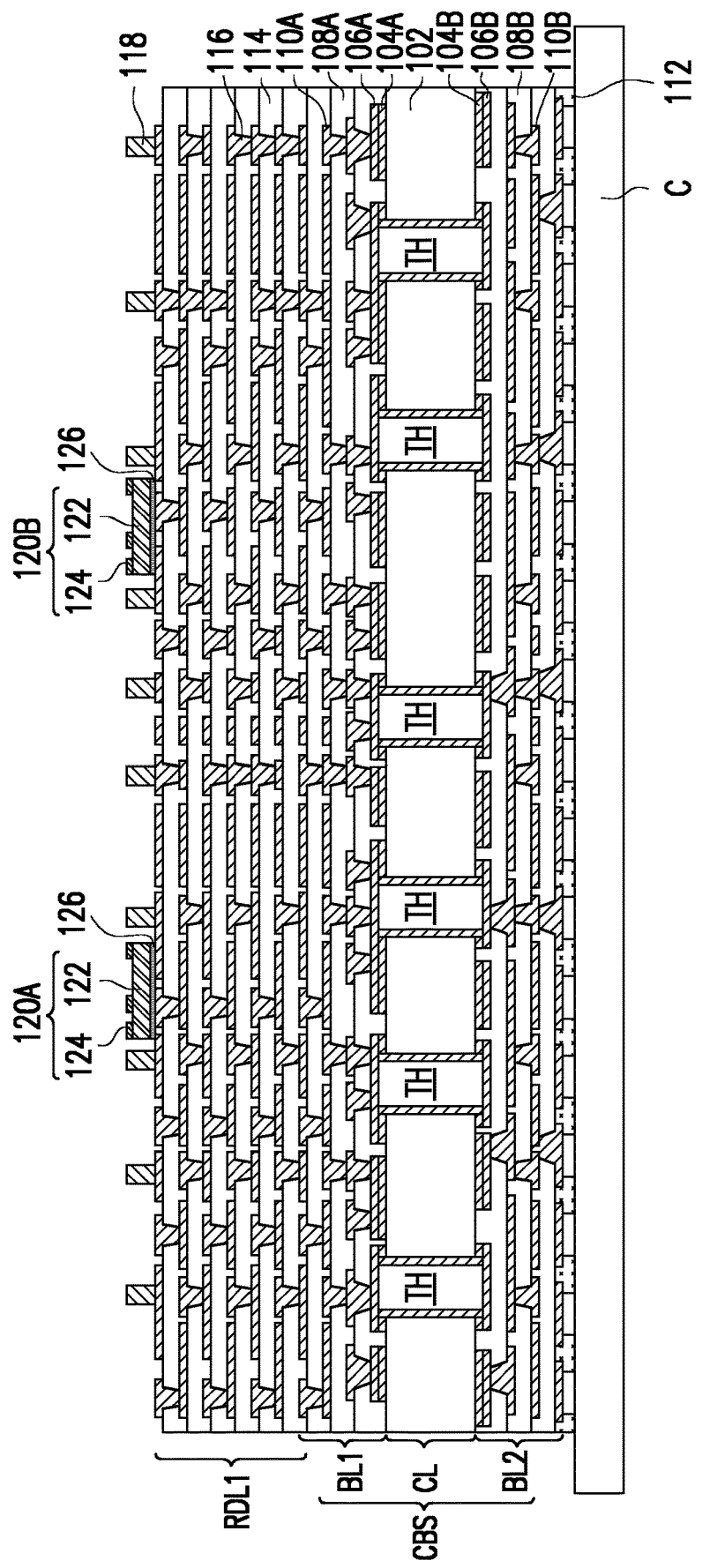

Referring to FIG. 1D, a plurality of connectors 118 and a plurality of dies 120A, 120B are disposed over the redistribution layer structure RDL1. In some embodiments, the connectors 118 are formed on the topmost conductive patterns 116 of the redistribution layer structure RDL1, so as to provide electrical connection for the redistribution layer structure RDL1 to other components disposed thereon. The connectors 118 may be conductive pillars, and the connectors 118 may be formed by an electroplating or an electroless plating.

In some embodiments, after forming the connectors 118, the dies 120A, 120B may be respectively mounted onto the topmost conductive patterns 116 between two adjacent connectors 118. In some embodiments, the dies 120A, 120B may be bus dies which provides a shorter electrical connection path between other semiconductor dies assembled in wafer-level package. In some embodiments, the die 120A, 120B includes an interconnecting structure and may be free of any active and/or passive device(s). The die 120A (or 120B) may also include a substrate 122 and a plurality of conductive patterns 124 on the substrate 122. In some embodiments, the substrate 122 is a semiconductor substrate such as a silicon substrate, or the likes. The die 120A (or 120B) may also include conductive patterns or traces (not shown) in the substrate 122, and the conductive patterns or traces may be electrically connected with the conductive patterns 124 of the die 120A (or 120B). In some embodiments, the conductive patterns or traces may be disposed in or on the substrate 122. In some embodiments, the conductive patterns 124 may be densely arranged, so that the die 120A, 120B may provide high density of interconnect elements. In some embodiments, the conductive pattern 124 may have a single or multiple layered structure. A material of the conductive pattern 124 includes copper, aluminum, a combination thereof, or the like. In some embodiments, a thickness of the die 120A, 120B is in a range of 10 µm to 100 µm, and x-y dimension of the die 120A, 120B is in a range of 2 mm×3 mm to 40 mm×80 mm. In some embodiments, the die 120A, 120B may be mounted onto the conductive patterns 116 through an adhesive layer 126 such as a die attach film (DAF). In some embodiments, the die 120A, 120B is not electrically connected to the redistribution layer structure RDL1. However, the disclosure is not limited thereto. In some alternative embodiments, the die 120A, 120B may have through silicon vias, and the die 120A, 120B may be bonded to the redistribution layer structure RDL1 by solder balls to electrically connect to the redistribution layer structure RDL1 directly. In some embodiments, top surfaces of the connectors 118 may be substantially coplanar with top surfaces of the conductive patterns 124 of the dies 120A, 120B. However, in some alternative embodiments, the top surfaces of the connectors 118 may be lower or higher than the top surfaces of the conductive patterns 124 of the dies 120A, 120B.

Figure 1E:
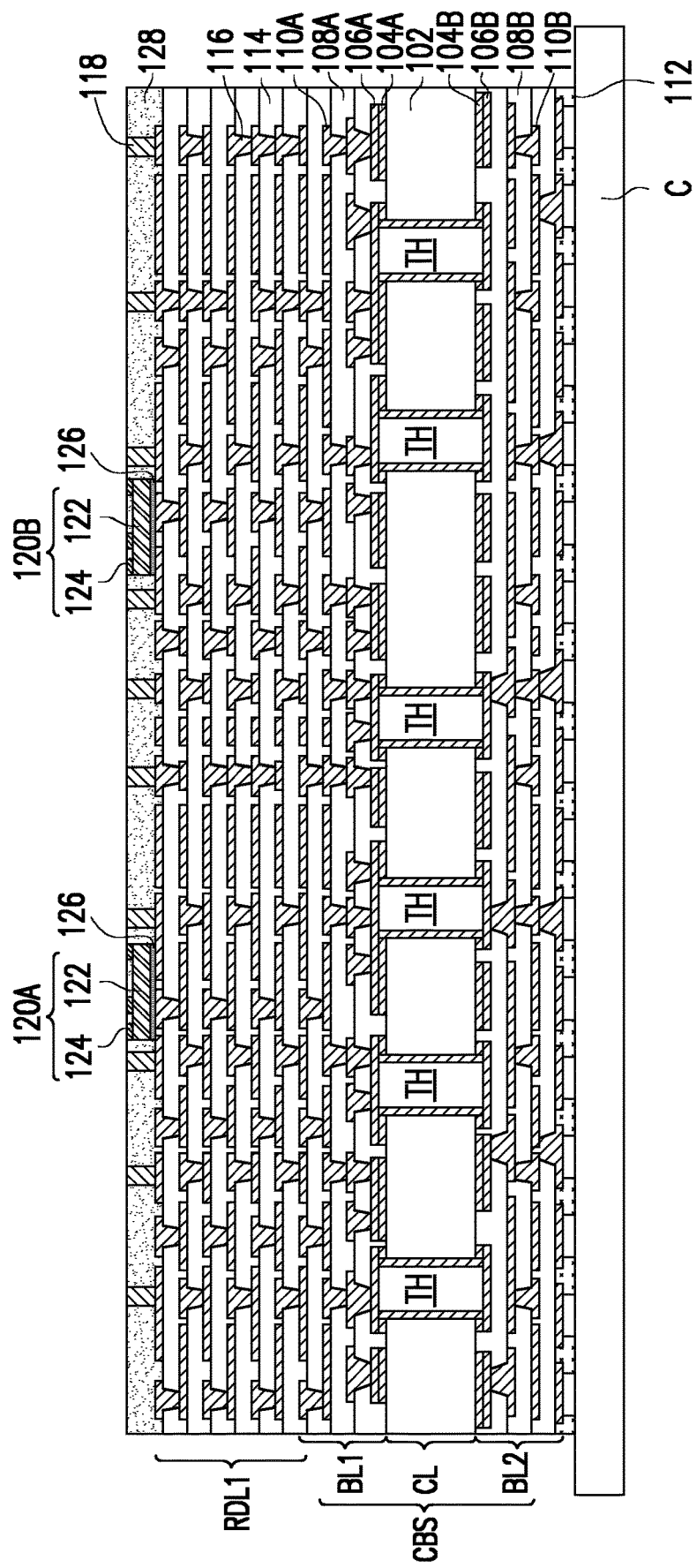

Referring to FIG. 1E, an encapsulant 128 is formed over the redistribution layer structure RDL1 to encapsulate the connectors 118 and the dies 120A, 120B. In some embodiments, an insulating material is formed over the redistribution layer structure RDL1 to cover the connectors 118 and the dies 120A, 120B. Then, the insulating material is grinded until the connectors 118 and the conductive patterns 124 of the dies 120A, 120B are exposed, so as to form the encapsulant 128. The encapsulant 128 encapsulates the lateral sidewalls of the dies 120A, 120B and the conductive patterns 124 disposed thereon, and exposes the top surfaces of the conductive patterns 124 of the dies 120A, 120B. In other words, the dies 120A, 120B are embedded in the encapsulant 128 with the exposed top surfaces. In some embodiments, the conductive patterns 124 of the dies 120A, 120B may be encapsulated and in contact with the encapsulant 128. The connectors 118 are disposed in and penetrate the encapsulant 128. In some embodiments, the encapsulant 128 includes a molding compound such as an epoxy molding compound formed by a molding process. In some alternative embodiments, the encapsulant 128 may include an epoxy, a resin or the like. In some embodiments, a thickness of the encapsulant 128 is in a range of 5 µm to 100 µm. The top surfaces of the connectors 118 and the dies 120A, 120B are substantially coplanar with the top surface of the encapsulant 128.

Figure 1F:
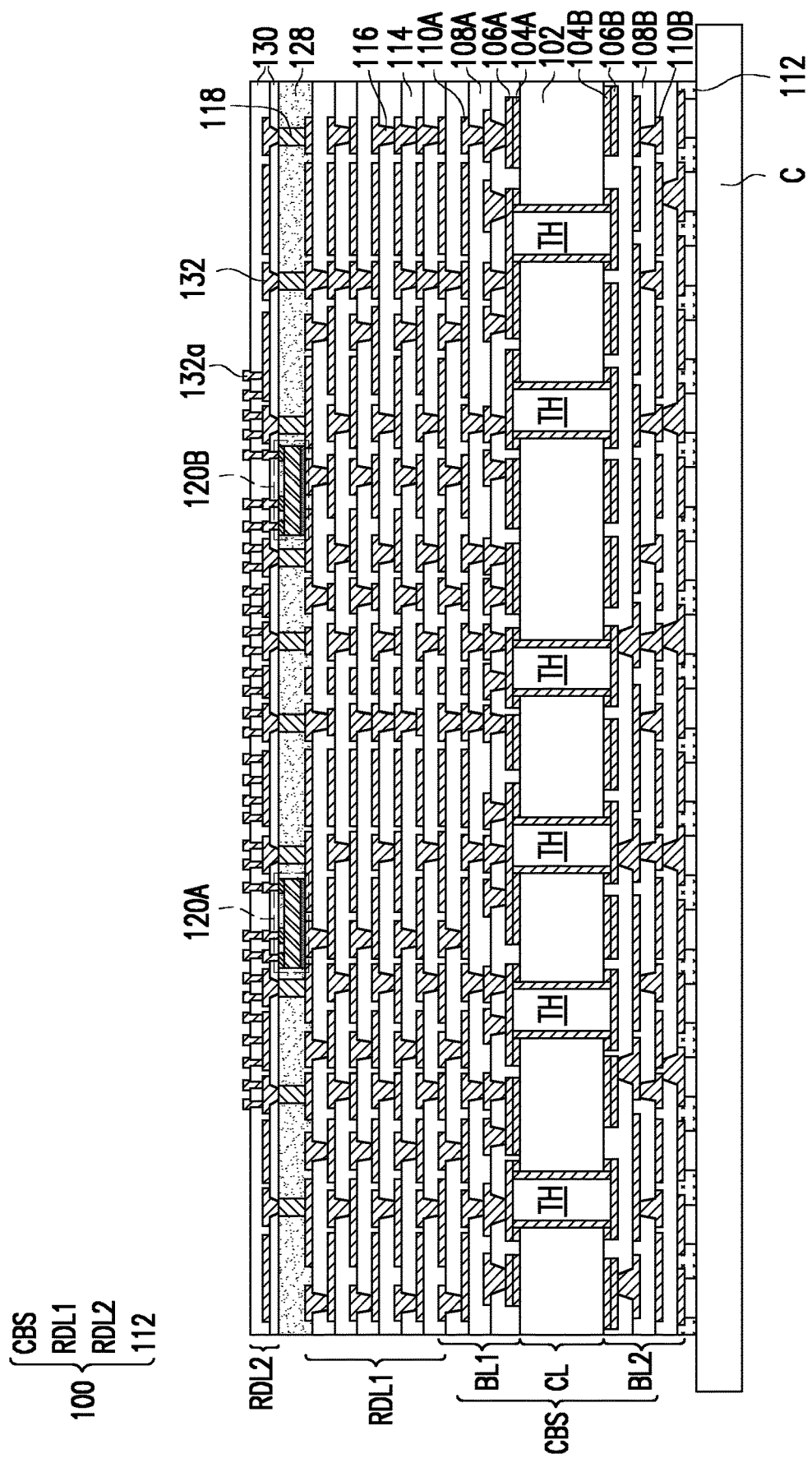

Referring to FIG. 1F, after forming the encapsulant 128, a redistribution layer structure RDL2 is formed over the encapsulant 128 which electrically connects to the connectors 118 and the dies 120A, 120B. In some embodiments, the redistribution layer structure RDL2 may include a plurality of dielectric layers 130 and a plurality of conductive patterns 132, 132a which are alternately stacked over the encapsulant 128. In some embodiments, a thickness of the dielectric layer 130 is in a range of 2 µm to 50 µm. In some embodiments, the topmost conductive patterns 132a are conductive terminals, which may include a plurality of conductive pillars and a plurality of under-ball metallurgy (UBM) patterns for ball mount. In some embodiments, the diameter of the topmost conductive pattern 132a is less than the diameter of the lower conductive pattern 132. In some embodiments, the pitch between the topmost conductive patterns 132a may be 20 μm to 80 μm, and the diameter of the topmost conductive pattern 132a may be between 10 μm to 25 μm. In some embodiments, materials of the dielectric layers 130 may be similar to the materials of dielectric layers 114 and are different from the material of the encapsulant 128. At this point, an integrated package substrate 100 is fabricated. In some embodiments, the integrated package substrate 100 includes the circuit board structure CBS (i.e., a semi-finished circuit substrate), the redistribution layer structures RDL1, RDL2 and the patterned mask layer 112, where the redistribution layer structure RDL1, RDL2 and the patterned mask layer 112 are disposed on two opposite surfaces of circuit board structure CBS. In some embodiments, the integrated package substrate 100 has a high modulus such as in a range of 15 GPa to 50 GPa.

Figure 1G:
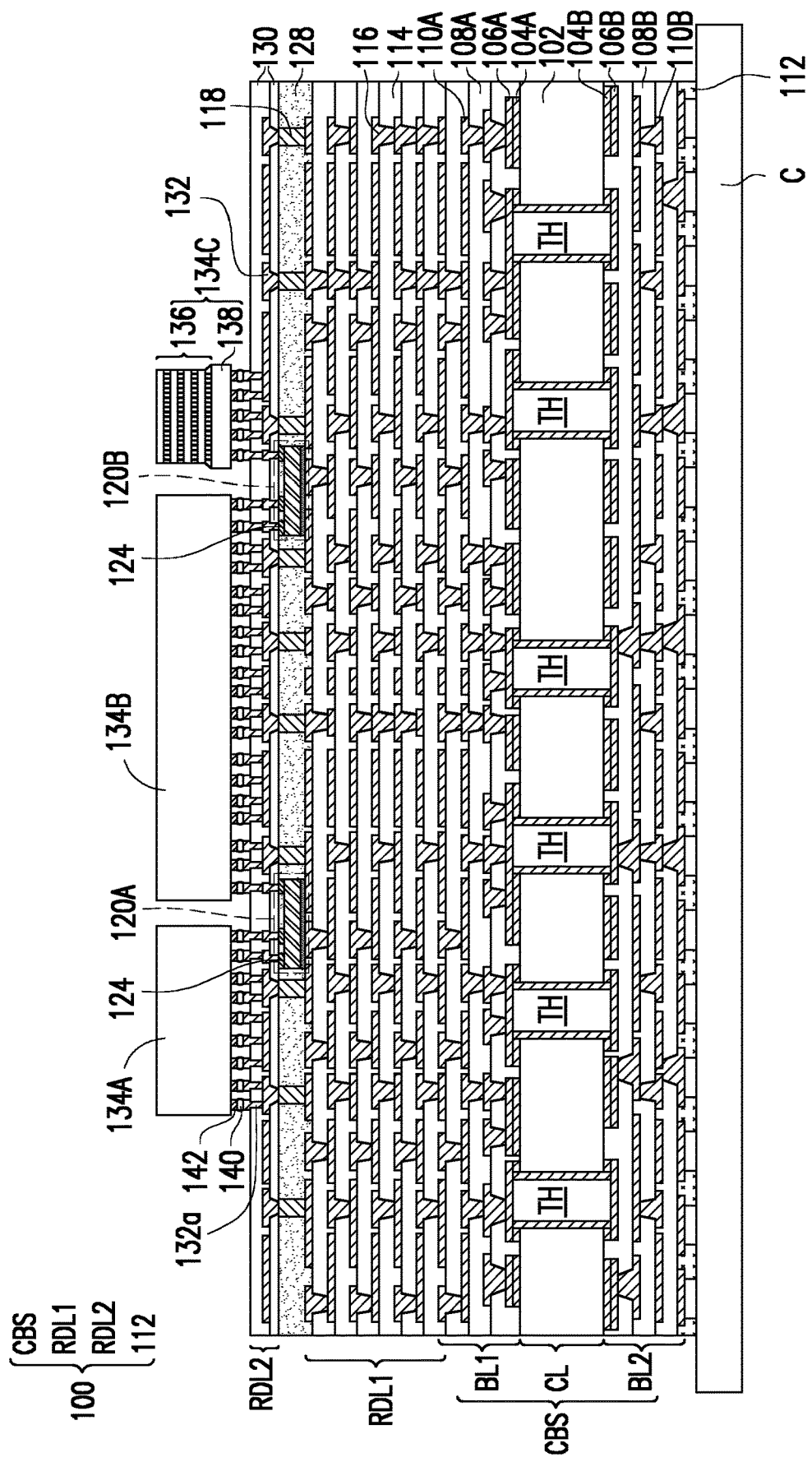

Referring to FIG. 1G, a plurality of package components 134A, 134B, 134C are bonded to the redistribution layer structure RDL2 of the integrated package substrate 100. In some embodiments, the package components 134A, 134B, 134C may be bonded to the exposed conductive patterns 132a of the redistribution layer structure RDL2 through bonding elements 140. In some embodiments, the bonding elements 140 may be formed on the redistribution layer structure RDL2 or the package components 134A, 134B, 134C. In some embodiments, the bonding elements 140 are solder regions such as micro-bumps. In some embodiments, the pitch between the bonding elements 140 may be 20 μm to 80 μm, and the diameter of the bonding elements 140 may be between 5 μm to 55 μm. After bonding, the bonding elements 140 are electrically connected to the connectors 118 and the dies 120A, 120B through the redistribution layer structure RDL2.

In some embodiments, each of the package components 134A, 134B, 134C is a package, a device die, a die stack, and/or the like. The device die may be high performance integrated circuit, such as a System-on-Chip (SoC) die, a Central Processing Unit (CPU) die, a Graphic Processing Unit (GPU) die, field-programmable gate array (FPGA) die, a mobile application die, a memory die, or a die stack. In some embodiments, the memory die is a memory cube such as High Bandwidth Memory (HBM) cube. The package components 134A, 134B, 134C may have the respective semiconductor substrates (not shown) in the respective dies. In some embodiments, a rear surface of the semiconductor substrates is a surface that faces upward in accordance to the orientation illustrated in FIG. 1G. The package components 134A, 134B, 134C further include integrated circuit devices (such as active devices including transistors, not shown) at a front surface (e.g., a surface facing downward in FIG. 1G) of the respective semiconductor substrates. In one of the embodiments, the package components 134A, 134B are SoC dies, and the package component 134C is a HBM cube. In the embodiment, the package component 134C includes a die stack 136 and a controller 138 at the bottom of the die stack 136 where underfills may be formed between dies of the die stack 136 and between the die stack 136 and the controller 138. The package components 134A, 134B, 134C described above are for the purpose of illustration, however, the disclosure is not intended to limit thereto. In some other embodiments, the package components 134A, 134B, 134C may have a combination of any type of devices or dies described above. Further, the package components 134A, 134B, 134C may have the same or different sizes and functions upon the design requirements.

Figure 1H:
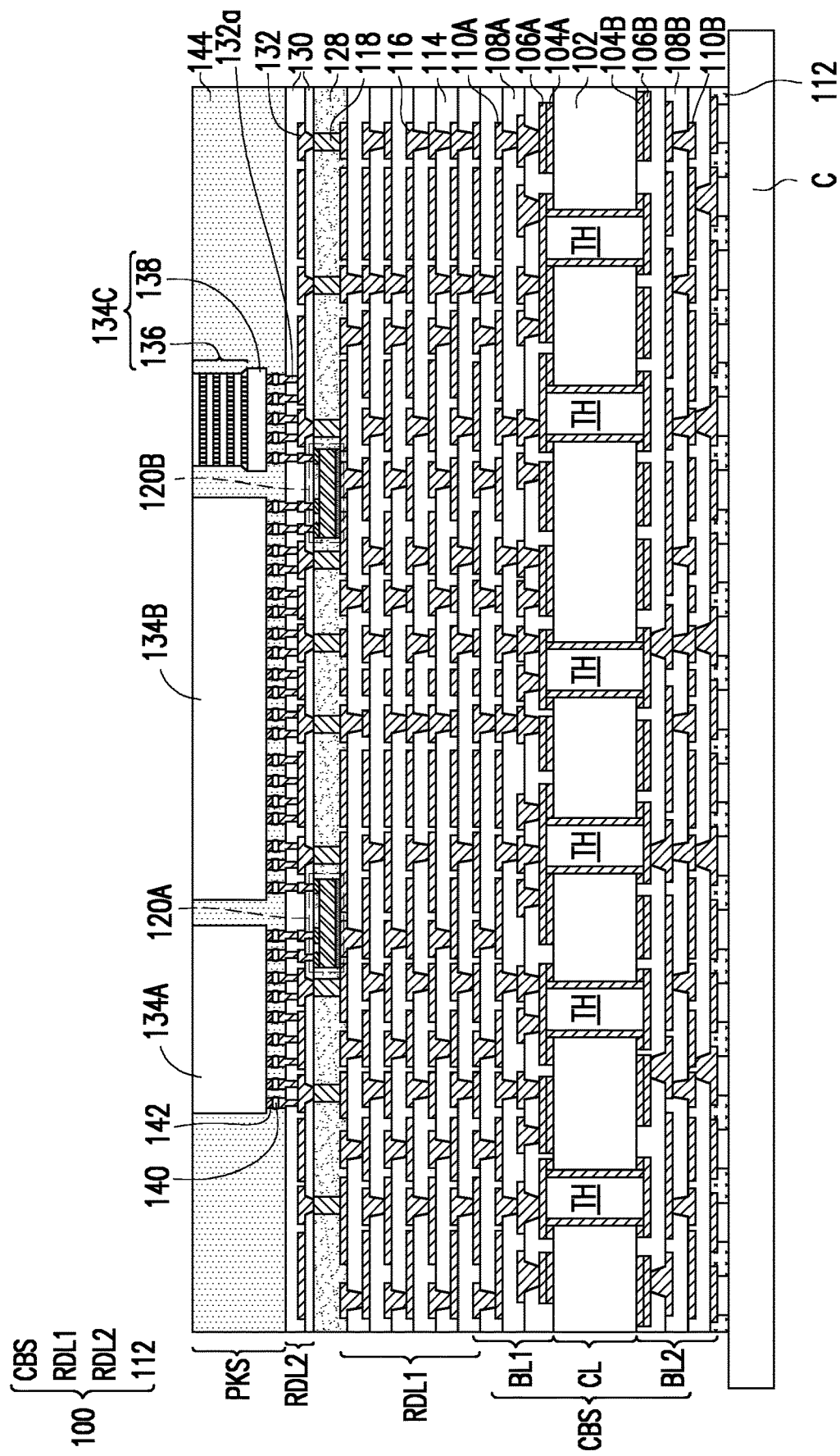

In some embodiments, the package components 134A, 134B, 134C respectively have a plurality of connectors 142 such as bonding pads. In some embodiments, as shown in FIG. 1H, after the connectors 142 are electrically connected to the redistribution layer structure RDL2, sidewalls of the connectors 142 may be exposed. In some alternative embodiments, the package components 134A, 134B, 134C may further include an insulating layer, and the connectors 142 may be embedded in an insulating layer, where the insulating layer covers the sidewalls of each connector 142. In some alternative embodiments, an underfill may be formed aside the package components 134A, 134B, 134C after the package components 134A, 134B, 134C bonding to the redistribution layer structure RDL2, and the underfill covers the sidewalls of the connectors 142. In some embodiments, the package components 134A, 134B, 134C are bonded to the redistribution layer structure RDL2 by using flip-chip bonding. In detail, the connectors 142 of the package components 134A, 134B, 134C are bonded to the bonding elements 140, and the active surfaces of the package components 134A, 134B, 134C face the circuit board structure CBS.

In some embodiments, the package components 134A, 134B, 134C are also referred to as a first package component 134A, a second package component 134B, and a third package component 134C, where the first package component 134A is adjacent to the second package component 134B, and the second package component 134B is adjacent to the third package component 134C. The dies 120A, 120B are disposed below and between the package components 134A, 134B, 134C and electrically connected to the package components 134A, 134B, 134C. For example, in some embodiments, the die 120A is disposed in a location that is below and between the package components 134A, 134B so as to provide or establish short and fast electrical connections between the first and second package components 134A, 134B. Similarly, the die 120B may be disposed in a location that is below and between the second and third package components 134B, 134C so as to provide or establish short and fast electrical connections between the second and third package components 134B, 134C. In detail, the first package component 134A may communicate with the second package component 134B through an electrical path (or communication path) formed by the connector 142, the bonding element 140 and the conductive pattern 124 of the die 120A. In some embodiments, the die 120A, 120B are elongated between two adjacent columns of the package components 134A, 134B, 134C as a bar, for example. In other embodiments, the dies 120A, 120B interconnect the package components that are not adjacent to each other. For example, the die 120A may interconnect the first package component 134A to the third package component 134C with the second package component 134B being disposed therebetween.

Referring to FIG. 1H, an encapsulant 144 is formed over the redistribution layer structure RDL2 to encapsulate the package components 134A, 134B, 134C, to form a package structure PKS. In some embodiments, an insulating material is formed over the redistribution layer structure RDL2 to cover the package components 134A, 134B, 134C. Then, the insulating material is grinded until the package components 134A, 134B, 134C are exposed, so as to form the encapsulant 144. In some embodiments, the encapsulant 144 may include a molding underfill. The encapsulant 144 may be a molding compound, an epoxy, a resin or the like. The encapsulant 144 encapsulates the sidewalls of the package components 134A, 134B, 134C, and exposes the rear surfaces of the package components 134A, 134B, 134C. In some embodiments, the encapsulant 144 is extended over an entire top surface of the redistribution layer structure RDL2, and a sidewall of the encapsulant 144 is substantially flush with a sidewall of the redistribution layer structure RDL2. In some embodiments, the encapsulant 144 may be a molding compound formed by a molding process. A thickness of the package structure PKS may be in a range of 50 μm to 1500 μm, and a width of the package structure PKS may be in a range of 30 mm to 500 mm. In some embodiments, the encapsulant 144 is formed after the package components 134A, 134B, 134C are bonded to the redistribution layer structure RDL2 over the circuit board structure CBS. In other words, the package structure PKS is formed after sequentially forming the package components 134A, 134B, 134C and the encapsulant 144 over the circuit board structure CBS. However, the disclosure is not limited thereto. In some alternative embodiments, a pre-formed package structure PKS may be bonded to the redistribution layer structure RDL2 over the circuit board structure CBS.

Figure 1I:
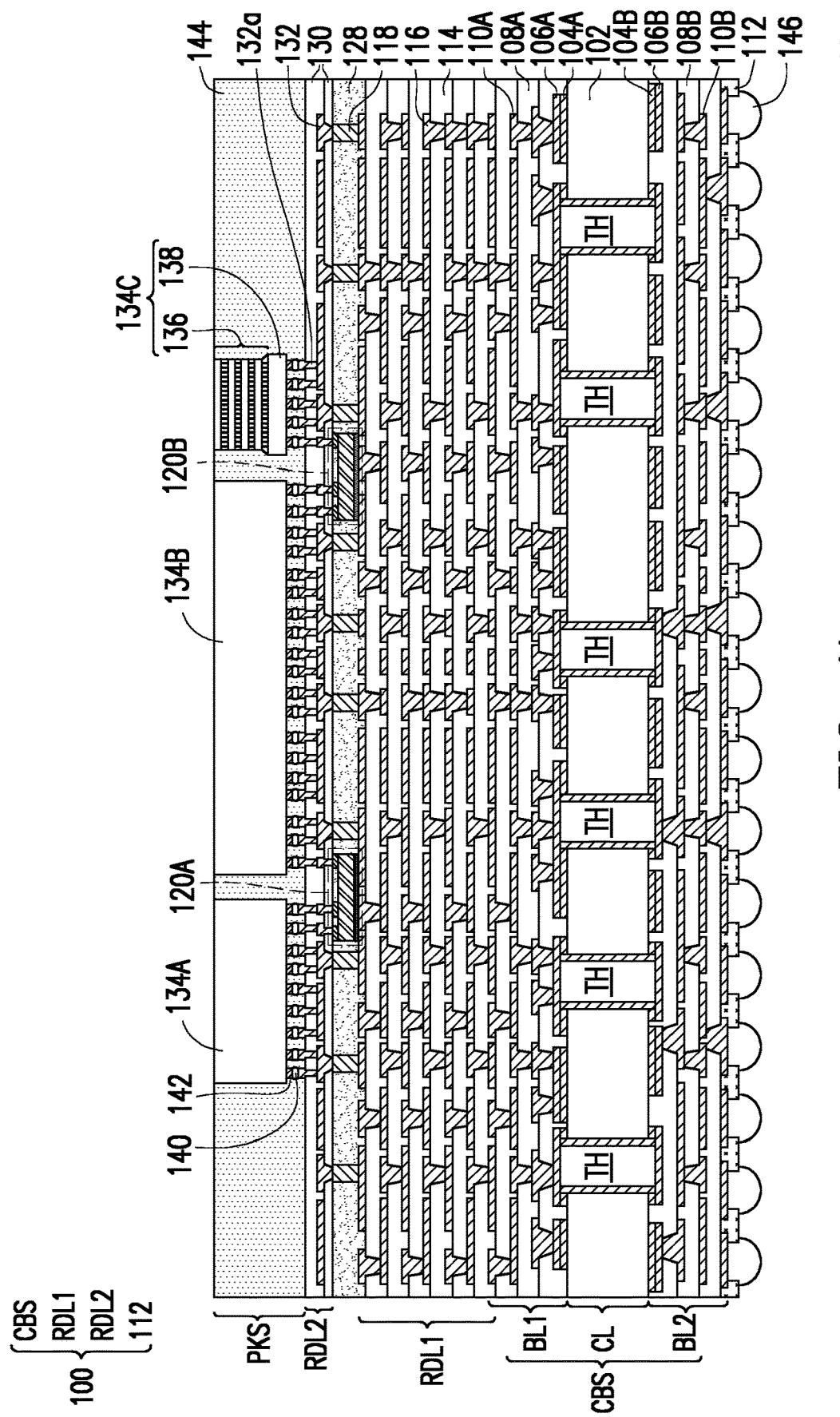

Referring to FIG. 1I, the circuit board structure CBS with the package thereover is de-bonded from the carrier C. Then, a plurality of conductive terminals 146 are formed in the openings of the patterned mask layer 112 over the second build-up layer BL2. The conductive terminals 146 are electrically connected to the outermost second conductive patterns 110B in the second build-up layer BL2 of the circuit board structure CBS. The conductive terminals 146 may be ball grid array (BGA) connectors, solder balls, metal pillars, and/or the like. In some embodiments, the conductive terminals 146 may be formed by a mounting process and a reflow process. In some embodiments, as shown in FIG. 1I, the opening of the patterned mask layer 112 are filled with the conductive terminals 146 and the top surfaces of the patterned mask layer 112 are covered by the conductive terminals 146 while the conductive terminals 146 are separated from each other. However, the disclosure is not limited thereto. In some alternative embodiments, the top surfaces of the patterned mask layer 112 may not be partially covered by the conductive terminals 146. For example, the opening of the patterned mask layer 112 may be partially filled with the conductive terminals 146. That is, a gap may be formed between the conductive terminal 146 and the patterned mask layer 112. In certain embodiments, the conductive terminals 146 are available to be mounted onto additional electrical components (e.g., circuit carrier, system board, mother board, etc.). In some alternative embodiments, pads may be formed in the openings of the patterned mask layer 112 between the conductive terminals 146 and the outermost second conductive patterns 110B.

At this point, a semiconductor package 10 is fabricated. In some embodiments, the semiconductor device 10 includes the circuit board structure CBS, the package structure PKS, and the redistribution layer structures RDL1, RDL2 and the connectors 118 and the dies 120A, 120B between the circuit board structure CBS and the package structure PKS. In some embodiments, two immediately adjacent package components (134A/134B or 134B/134C) communicate to each other by the die 120A or 120B therebetween and therebeneath. However, the disclosure is not limited thereto, and in some alternative embodiments, the die may be disposed at any location between the package structure and the circuit board structure to communicate the package components adjacent or not adjacent to one another. In some embodiments, requirements for high performance computing and high bandwidth communication between the package components are satisfied, and reliability of the semiconductor package is improved. Accordingly, the technique may be applied to form the semiconductor package with a super large size equal to 70 mm×70 mm or more such as 100 mm×100 mm. In addition, the fabrication of the semiconductor package is performed by a one-stop shop like process flow in an environment such as standard silicon fabrication environment. Thus, efficiency of fabricating the semiconductor package may be improved, and yield of the semiconductor package may be increased. Furthermore, by forming RDLs over the semi-finished circuit substrate, the final substrate has a high modulus and a reduced thickness, and rigidity, inductance and resistance of the whole semiconductor package is enhanced and cost is reduced.

Figure 2:
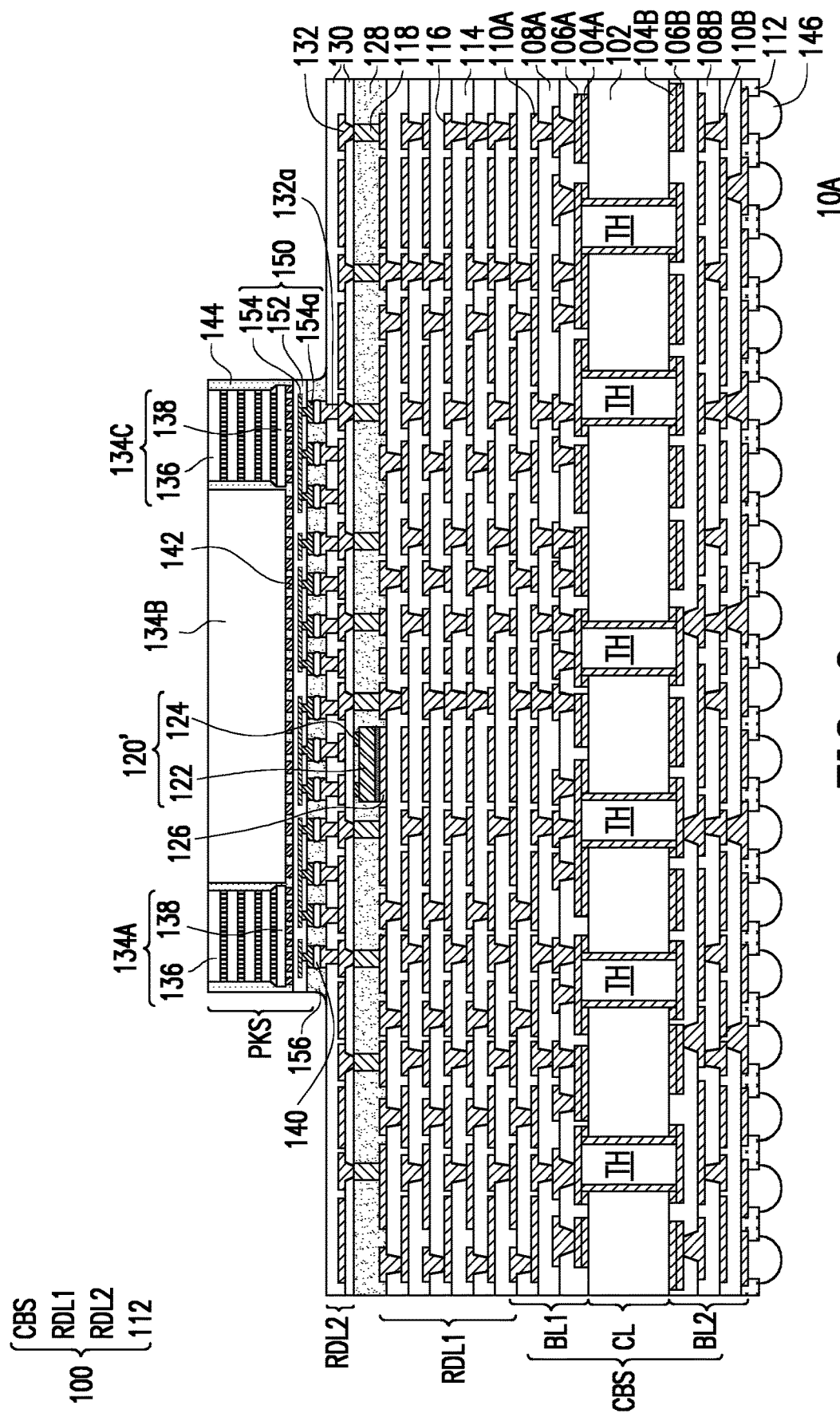
FIG. 2 is a schematic cross-sectional view illustrating a semiconductor package in accordance with some embodiments of the disclosure.

FIG. 2 is a schematic sectional view of a semiconductor package according to some exemplary embodiments of the present disclosure. The semiconductor package 10A illustrated in FIG. 2 is similar to the semiconductor package 10 illustrated in FIG. 1I, hence the same reference numerals are used to refer to the same and liked parts, and its detailed description will be omitted herein. The difference between the semiconductor package 10 and the semiconductor package 10A is in the configuration of the die, the package structure and the redistribution layer structure. For example, in the embodiment shown in FIG. 1I, the dies 120A and 120B are designed to electrically connect to the adjacent package components 134A/134B and 134B/134C. However, in the embodiment shown in FIG. 2, the die 120' may be electrically to the whole package structure PKS rather than adjacent package components 134A, 134B, 134C. In some embodiments, the die 120' may be disposed at any location between the redistribution layer structures RDL1 and RDL2, in the encapsulant 128. The die 120' is electrically connected to the package structure PKS through the redistribution layer structure RDL2. In some embodiments, the die 120' includes a substrate 122 and the conductive patterns 124 thereon. The die 120' is a device die, and the device die is an integrated voltage regulator (IVR) die, an integrated passive device (IPD) die, a memory die such as static random access memory (SRAM) die or the like, which is a component to realize a system on wafer package with the package components 134A, 134B, 134C of the package structure PKS. In some embodiments, the die 120' may be attached to the redistribution layer structure RDL1 through an adhesive layer 126 therebetween and the die 120' may be not directly connected to the redistribution layer structure RDL1 by a conductor. However, in some alternative embodiments, the die 120' may be electrically connected to the redistribution layer structure RDL1. In some embodiments, the redistribution layer structure RDL2 is formed over the encapsulant 128 to electrically connect to the connectors 118 and the die 120'. In some embodiments, the topmost conductive patterns 132a of the redistribution layer structure RDL2 may be UBM patterns for ball mount. The diameter of the topmost conductive pattern 132a may be similar to the diameter of the lower conductive pattern 132.

In some embodiments, the package structure PKS may include System-On-Chip (SoC) packages, Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. In some embodiments, the package structure PKS may be pre-formed before bonding to the redistribution layer structure RDL2. In detail, the package structure PKS includes two or more package components, for example, the three package components 134A, 134B and 134C as shown in FIG. 2, the encapsulant 144 encapsulating the package components 134A, 134B, 134C, and a redistribution layer structure 150. In some embodiments, the connectors 142 of the package component 134A, 134B, 134C may be encapsulated by the encapsulant 144 as shown in FIG. 2, or may be alternately disposed in a dielectric layer (not shown) which is then encapsulated by the encapsulant 144. In some embodiments, the package components 134A, 134C may be memory cubes, and the package component 134B may be CPU, GPU, FPGA or other suitable high performance integrated circuit. In some embodiments, the redistribution layer structure 150 is across the package components 134A, 134B, 134C and the encapsulant 144 and electrically connected to the package components 134A, 134B, 134C. The redistribution layer structure 150 includes a plurality of dielectric layers 152 and a plurality of conductive patterns 154 and 154a alternately stacked across the package components 134A, 134B, and 134C. The outermost conductive patterns 154a are used as conductive terminals, which may include a plurality of conductive pillars and a plurality of under-ball metallurgy (UBM) patterns for ball mount to the redistribution layer structure RDL2. In some embodiments, the package structure PKS may be bonded to the topmost conductive patterns 132a of the redistribution layer structure RDL2 through the bonding elements 140. In some embodiments, the bonding elements 140 are solder regions such as controlled collapse chip connection (C4) bumps. The bonding elements 140 may be formed on the topmost conductive patterns 132a of the redistribution layer structure RDL2 or the outermost conductive patterns 154a of the package structure PKS. After bonding, an underfill 156 may be dispensed to protect the bonding structure between the package structure PKS and the redistribution layer structure RDL2. In some embodiments, the encapsulant 144 is formed before bonding to the redistribution layer structure RDL2, and thus a sidewall of the encapsulant 144 is substantially flush with a sidewall of the redistribution layer structure 150 rather than a sidewall of the redistribution layer structure RDL2. In some embodiments, a total thickness ranging from a bottom of the underfill 156 to a top of the package structure PKS may be in a range of 50 µm to 1500 µm.

In some embodiments, the die 120' such as an IVR die, an IPD die or a SRAM die is embedded in the encapsulant 128 between the redistribution layer structures RDL1, RDL2 and electrically connected to the package structure PKS. In other words, the die 120' is integrated with the package structure PKS, and thus system on wafer or system in package (SiP) may be realized.

In some embodiments, the semiconductor package includes the circuit substrate, the redistribution layer structures over the circuit substrate, the die and the connectors embedded in the encapsulant between the redistribution layer structures, and the package structure including a plurality of package components over the redistribution layer structures. In some embodiments, the die is a bus die or device die such as IVR die, IPD die or SRAM, and the die is embedded between the redistribution layer structures by forming the encapsulant therearound. In some embodiments, by the above configuration, the die is electrically connected to the adjacent package components to communicates the package components without chip to package interaction, and thus the high bandwidth communication between the chips may be performed. In addition, since the requirements of high data rate, increasing bandwidth and lowering latency may be satisfied and reliability between the components is increased, the said high bandwidth communication may be also applied to a package with a super large size. In some embodiments, the die is electrically connected to the package structure to integrate with the package structure to provide additional function, and therefore a system on wafer structure or system in package may be realized. Accordingly, the above configuration may be used in high performance computing application.

In accordance with some embodiments of the present disclosure, a semiconductor package includes a first redistribution layer structure, a package structure, a bus die and a plurality of connectors. The package structure is disposed over the first redistribution layer structure, and includes a plurality of package components. The bus die and the connectors are encapsulated by a first encapsulant between the package structure and the first redistribution layer structure. The bus die is electrically connected to two or more of the plurality of package components, and the package structure are electrically connected to the first redistribution layer structure through the plurality of connectors.

In accordance with various embodiments of the present disclosure, a semiconductor package includes a first redistribution layer structure, a plurality of connectors and a die, a second redistribution layer structure and a package structure. The connectors and the die are encapsulated by a first encapsulant and disposed over the first redistribution layer structure. The second redistribution layer structure is disposed over the first encapsulant. The package structure includes a plurality of package components and is disposed over the second redistribution layer structure. The die is electrically connected to the package structure through the second redistribution layer structure and the plurality of connectors electrically connects the first redistribution layer structure and the second redistribution layer structure.

In accordance with some embodiments of the present disclosure, a method of manufacturing a semiconductor package includes the following steps. A plurality of connectors is formed over a first redistribution layer structure. A die is mounted onto the first redistribution layer structure. A first encapsulant is formed to encapsulate the die and the plurality of connectors. A second redistribution layer structure is formed over the first encapsulant to electrically connect to the die and the connectors. A plurality of package components are bonded onto the second redistribution layer structure, wherein the die is electrically connected to at least two of the plurality of package components.

In accordance with some embodiments of the present disclosure, a semiconductor package includes a circuit structure, a first redistribution layer, a second redistribution layer, a first encapsulant, a bus die and a plurality of through vias. The first redistribution layer is disposed over the circuit structure. The second redistribution layer is disposed over the first redistribution layer. The first encapsulant is disposed between the first redistribution layer and the second redistribution layer. The through vias surround the bus die. The first encapsulant is extended along an entire sidewall of the bus die, and a first surface of the bus die is substantially coplanar with top surfaces of the first encapsulant and the plurality of through vias.

In accordance with some embodiments of the present disclosure, a semiconductor package includes a first redistribution layer, a connector, a first die, a second redistribution layer and a second die. The first die is encapsulated by a first encapsulant over the first redistribution layer. The second redistribution layer is disposed over the first encapsulant. The second die is disposed over the second redistribution layer and electrically connected to the first die.

Sidewalls of the first redistribution layer, the second redistribution layer and the first encapsulant are substantially flush.

In accordance with some embodiments of the present disclosure, a semiconductor package includes a first redistribution layer, a second redistribution layer, a first encapsulant, a die and a plurality of through vias. The first redistribution layer is disposed over the circuit structure. The second redistribution layer is disposed over the first redistribution layer. The first encapsulant and the die are disposed between the first redistribution layer and the second redistribution layer. A first surface of the die is substantially coplanar with top surfaces of the plurality of through vias, and a second surface opposite to the first surface of the die is substantially coplanar with bottom surfaces of the plurality of through vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a circuit structure;
a first redistribution layer over the circuit structure;
a second redistribution layer over the first redistribution layer;
a first encapsulant, disposed between the first redistribution layer and the second redistribution layer, wherein the first encapsulant comprises a molding compound; and
a bus die and a plurality of through vias surrounding the bus die, wherein the bus die comprises a substrate and a plurality of conductive patterns on the substrate, an entire sidewall of each of the conductive patterns of the bus die is continuous without a turning point, the first encapsulant is a single layer and extended along an entire sidewall of the substrate, the entire sidewall of each of the conductive patterns and an entire sidewall of each of the through vias, and top surfaces of the conductive patterns of the bus die are coplanar with top surfaces of the first encapsulant and the plurality of through vias.

2. The semiconductor package according to claim 1, wherein the circuit structure comprises a core layer, a first build-up layer on a first surface of the core layer, and a second build-up layer on a second surface of the core layer opposite to the first surface.

3. The semiconductor package according to claim 1, further comprising a plurality of semiconductor devices and a second encapsulant encapsulating the semiconductor devices over the second redistribution layer.

4. The semiconductor package according to claim 1, wherein sidewalls of the first redistribution layer, the second redistribution layer and the first encapsulant are substantially flush.

5. The semiconductor package according to claim 1, wherein a bottom surface of the bus die is substantially coplanar with bottom surfaces of the first encapsulant and the plurality of through vias.

6. The semiconductor package according to claim 1, wherein the bus die comprises an adhesive layer adhered to the first redistribution layer, and a bottom surface of the adhesive layer is coplanar with bottom surfaces of the first encapsulant and the plurality of through vias.

7. The semiconductor package according to claim 1, wherein the entire sidewall of each of the through vias is continuous without a turning point.

8. A semiconductor package, comprising:
a first redistribution layer comprising a first insulating layer;
a connector and a first die encapsulated by a first encapsulant over the first redistribution layer;
a second redistribution layer over the first encapsulant and comprising a second insulating layer and a plurality of first conductive patterns in the second insulating layer; and
a second die over the second redistribution layer, electrically connected to the first die, wherein the first encapsulant comprises a molding compound, a material of each of the first insulating layer and the second insulating layer is not the molding compound, top surfaces of a plurality of second conductive patterns of the first die are coplanar with top surfaces of the first encapsulant and the connector, and sidewalls of the first redistribution layer, the second redistribution layer and the first encapsulant are substantially flush.

9. The semiconductor package according to claim 8, wherein the first encapsulant is disposed between the connector and the first die.

10. The semiconductor package according to claim 8, further comprising a second encapsulant encapsulating the second die, wherein a sidewall of the second encapsulant is substantially flush with the sidewalls of the first redistribution layer, the second redistribution layer and the first encapsulant.

11. The semiconductor package according to claim 8, further comprising a circuit structure, wherein the first redistribution layer is disposed over the circuit structure, the circuit structure includes a core layer, a first build-up layer on a first surface of the core layer, and a second build-up layer on a second surface of the core layer opposite to the first surface.

12. The semiconductor package according to claim 8, wherein a bottom surface of the first die is coplanar with bottom surfaces of the connector and the first encapsulant.

13. The semiconductor package according to claim 8, wherein the first encapsulant is in direct contact with the first insulating layer and the second insulating layer.

14. A semiconductor package, comprising:
a first redistribution layer comprising a plurality of first insulating layers and a plurality of first conductive patterns in the first insulating layers;
a second redistribution layer over the first redistribution layer, comprising a plurality of second insulating layers and a plurality of second conductive patterns in the second insulating layers; and
a first encapsulant, a bus die and a plurality of through vias, disposed between the first redistribution layer and the second redistribution layer, wherein the first encapsulant comprises a molding compound, top surfaces of a plurality of third conductive patterns of the bus die are coplanar with top surfaces of the first encapsulant and the plurality of through vias, and sidewalls of the first insulating layers, the second insulating layers and the first encapsulant are substantially flush, and the second conductive patterns are bonded to conductive connectors of a die through solder regions.

15. The semiconductor package according to claim 14, wherein the first encapsulant is in physical contact with sidewalls of the plurality of third conductive patterns.

16. The semiconductor package according to claim 14, wherein the bus die comprises an adhesive layer, and a surface of the adhesive layer is substantially coplanar with bottom surfaces of the plurality of through vias.

17. The semiconductor package according to claim 16, wherein the adhesive layer is in physical contact with first conductive patterns in the first redistribution layer.

18. The semiconductor package according to claim 14, wherein the top surfaces of the third conductive patterns of the bus die are further coplanar with a bottom surface of a bottommost one of the second insulating layers of the second redistribution layer.

19. The semiconductor package according to claim 18, wherein a material of the second insulating layers comprises polyimide, polybenzoxazole (PBO), benzocyclobutene (BCB), phosphosilicate glass (PSG), borosilicate glass (BSG), boron-doped phosphosilicate glass (BPSG), silicon nitride, silicon oxide or a combination thereof.

20. The semiconductor package according to claim 14, wherein the second conductive patterns comprise a plurality of conductive vias and a plurality of conductive pads directly bonded to the conductive connectors of the die through the solder regions.

* * * * *